(12) United States Patent
Chung et al.

(10) Patent No.: US 10,746,819 B2
(45) Date of Patent: Aug. 18, 2020

(54) CORRECTING FIELD DISTORTION IN ELECTROMAGNETIC POSITION TRACKING SYSTEMS

(71) Applicant: GOOGLE LLC, Mountain View, CA (US)

(72) Inventors: Sherk Chung, Piedmont, CA (US); Ian Atkinson, Castro Valley, CA (US); Advait Jain, Santa Clara, CA (US); Lucine Oganesian, Mountain View, CA (US); Murphy Stein, San Jose, CA (US); Saket Patkar, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 108 days.

(21) Appl. No.: 15/707,995

(22) Filed: Sep. 18, 2017

(65) Prior Publication Data

US 2019/0086482 A1 Mar. 21, 2019

(51) Int. Cl.
*G01R 33/02* (2006.01)
*G01S 5/00* (2006.01)
(Continued)

(52) U.S. Cl.
CPC ............ *G01R 33/02* (2013.01); *G01S 5/0009* (2013.01); *G01S 5/16* (2013.01); *G01V 3/104* (2013.01);
(Continued)

(58) Field of Classification Search
CPC ......... G01R 33/02; G01S 5/0009; G01S 5/16; G01V 3/104; G02B 27/0172; H04B 5/0043
See application file for complete search history.

(56) References Cited

U.S. PATENT DOCUMENTS

| 4,394,831 A * | 7/1983 | Egli | G01B 7/004 |
| | | | 324/225 |
| 4,945,305 A * | 7/1990 | Blood | F41G 3/225 |
| | | | 324/207.11 |

(Continued)

FOREIGN PATENT DOCUMENTS

TW I1512548 B 12/2015

OTHER PUBLICATIONS

Livingston, M.A. & State, A., "Magnetic Tracker Calibration for Improved Augmented Reality Registration", Presence: Teleoperators and Virtual Environments, vol. 6, No. 5, 1997, 14 pages.

(Continued)

*Primary Examiner* — Patrick Assouad
*Assistant Examiner* — Demetrius R Pretlow (57) ABSTRACT

An electromagnetic (EM) position tracking system identifies the pose of objects based on detected strength values of an EM field. To address distortions in the field, the system employs a pose sensor to provide a second pose of the mobile unit. Under conditions where no distortion in the EM field has been detected, the HMD applies a nominal set of corresponding weights to the EM pose data and the IMU pose data, respectively, and combines the weighted pose value to identify a combined pose of the mobile unit. In response to detecting conditions that indicate distortion in the EM field, the HMD can apply different weights to the EM pose data and IMU pose data to, for example increase the influence of the IMU pose data on the combined pose.

19 Claims, 8 Drawing Sheets

(51) Int. Cl.
    *H04B 5/00*         (2006.01)
    *G01S 5/16*         (2006.01)
    *G01V 3/10*         (2006.01)
    *G02B 27/01*       (2006.01)

(52) U.S. Cl.
    CPC ....... *G02B 27/0172* (2013.01); *H04B 5/0043* (2013.01)

(56) References Cited

U.S. PATENT DOCUMENTS

| | | | | |
|---|---|---|---|---|
| 5,847,976 | A * | 12/1998 | Lescourret | F41G 3/225<br>703/8 |
| 6,369,564 | B1 * | 4/2002 | Khalfin | G01B 3/1084<br>324/207.12 |
| 6,577,976 | B1 * | 6/2003 | Hoff | G01C 17/38<br>324/246 |
| 7,640,106 | B1 * | 12/2009 | Stokar | G01C 21/16<br>342/147 |
| 8,854,282 | B1 * | 10/2014 | Wong | G06F 3/14<br>345/7 |
| 9,141,194 | B1 * | 9/2015 | Keyes | G06F 3/017 |
| 9,165,114 | B2 | 10/2015 | Jain et al. | |
| 10,132,636 | B2 * | 11/2018 | Lescourret | F41G 3/225 |
| 10,285,760 | B2 * | 5/2019 | Sadjadi | A61B 34/20 |
| 2005/0096883 | A1 * | 5/2005 | Pacey | G01V 3/08<br>702/193 |
| 2005/0246122 | A1 * | 11/2005 | Jones, Jr. | G01B 7/004<br>702/107 |
| 2006/0055712 | A1 * | 3/2006 | Anderson | A61B 5/06<br>345/647 |
| 2006/0100781 | A1 * | 5/2006 | Lin | G01C 21/28<br>701/472 |
| 2007/0101596 | A1 * | 5/2007 | Olson | G01C 17/38<br>33/356 |
| 2009/0082989 | A1 * | 3/2009 | Zuhars | G01B 7/003<br>702/150 |
| 2010/0168556 | A1 * | 7/2010 | Shen | G01S 5/021<br>600/424 |
| 2010/0201355 | A1 * | 8/2010 | Yamaguchi | G01R 33/0029<br>324/228 |
| 2010/0331671 | A1 * | 12/2010 | Martinelli | A61B 90/36<br>600/424 |
| 2012/0313626 | A1 * | 12/2012 | Cattin | G01V 3/081<br>324/207.13 |
| 2012/0323111 | A1 * | 12/2012 | Jain | G16H 50/50<br>600/411 |
| 2013/0238270 | A1 * | 9/2013 | Khalfin | G01D 18/00<br>702/94 |
| 2015/0149104 | A1 * | 5/2015 | Baker | G01R 33/0035<br>702/87 |
| 2015/0204994 | A1 * | 7/2015 | Landers | G01C 21/08<br>702/150 |
| 2016/0377688 | A1 * | 12/2016 | Kleiner | G01R 33/0035<br>324/202 |

OTHER PUBLICATIONS

International Search Report and Written Opinion dated Oct. 18, 2018 for corresponding International Application No. PCT/US2018/041791, 16 pages.
English Translation of Taiwanese Office Action dated Jun. 6, 2019 for corresponding TW Application No. 107121674, 5 pages.
Written Opinion of the International Examining Authority dated Aug. 20, 2019 for corresponding International Application No. PCT/US2018/041791, 7 pages.
International Preliminary Report on Patentability dated Apr. 2, 2020 for International Application No. PCT/US2018/041791, 11 pages.

* cited by examiner

CORRECTING FIELD DISTORTION IN ELECTROMAGNETIC POSITION TRACKING SYSTEMS

BACKGROUND

Field of the Disclosure

The present disclosure relates generally to position tracking systems and more specifically to electromagnetic (EM) position tracking systems.

Description of the Related Art

Position tracking systems that use near-field EM fields, also known as EM position tracking systems, generally include a transmitter that generates an EM field using a tri-axis coil to induce a current on a second tri-axis coil located at a remote receiver. The receiver generates values corresponding to the EM field magnitudes which are then processed to compute a position and/or orientation of the receiver relative to the transmitter. The position and/or orientation values are also known as "pose" values. EM position tracking systems typically rely on the EM field following a dipole model, where the magnitudes of the field at the receiving coils are proportional to the distance and orthogonality of the transmitting coils. Metallic objects present in the EM field, near either the transmitter or receiver, can change the shape and magnitudes of the EM field, causing inaccuracies and distortion in the pose values.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-8 illustrate techniques for reducing the effects of distortion on an EM position tracking system by employing distortion detection to identify unexpected deviations or disturbances in an EM field, and correcting pose errors resulting from the detected distortion. For example, an HMD may employ an EM position tracking system to identify the position of objects (e.g., hand controllers) used to manipulate items in a VR environment generated by the HMD. Metallic objects rigidly affixed to either the base unit or the mobile unit can create distortions in the EM field. These distortions can be compensated for by the EM position tracking system when the system is calibrated during manufacturing. However, metallic objects introduced into the EM field after calibration introduce unknown or unexpected distortions than conventionally are difficult to detect and correct for. To address these distortions, the system employs a pose sensor in a mobile unit (a hand controller) to provide a second pose measurement of the mobile unit. The pose sensor could be an inertial measurement unit (IMU) which can contain a gyroscope or an accelerometer, or could use other sensors to determine a pose of the mobile unit. Under conditions where no distortion in the EM field has been detected, the HMD applies a nominal set of corresponding weights to the EM pose data and the IMU pose data, respectively, and combines the weighted pose value to identify a combined pose of the mobile unit. In response to detecting conditions that indicate distortion in the EM field, the HMD can apply different weights to the EM pose data and IMU pose data to, for example increase the influence of the IMU pose data on the combined pose. The HMD thereby reduces pose errors resulting from such EM distortion, thereby improving the user experience.

Figure 1:
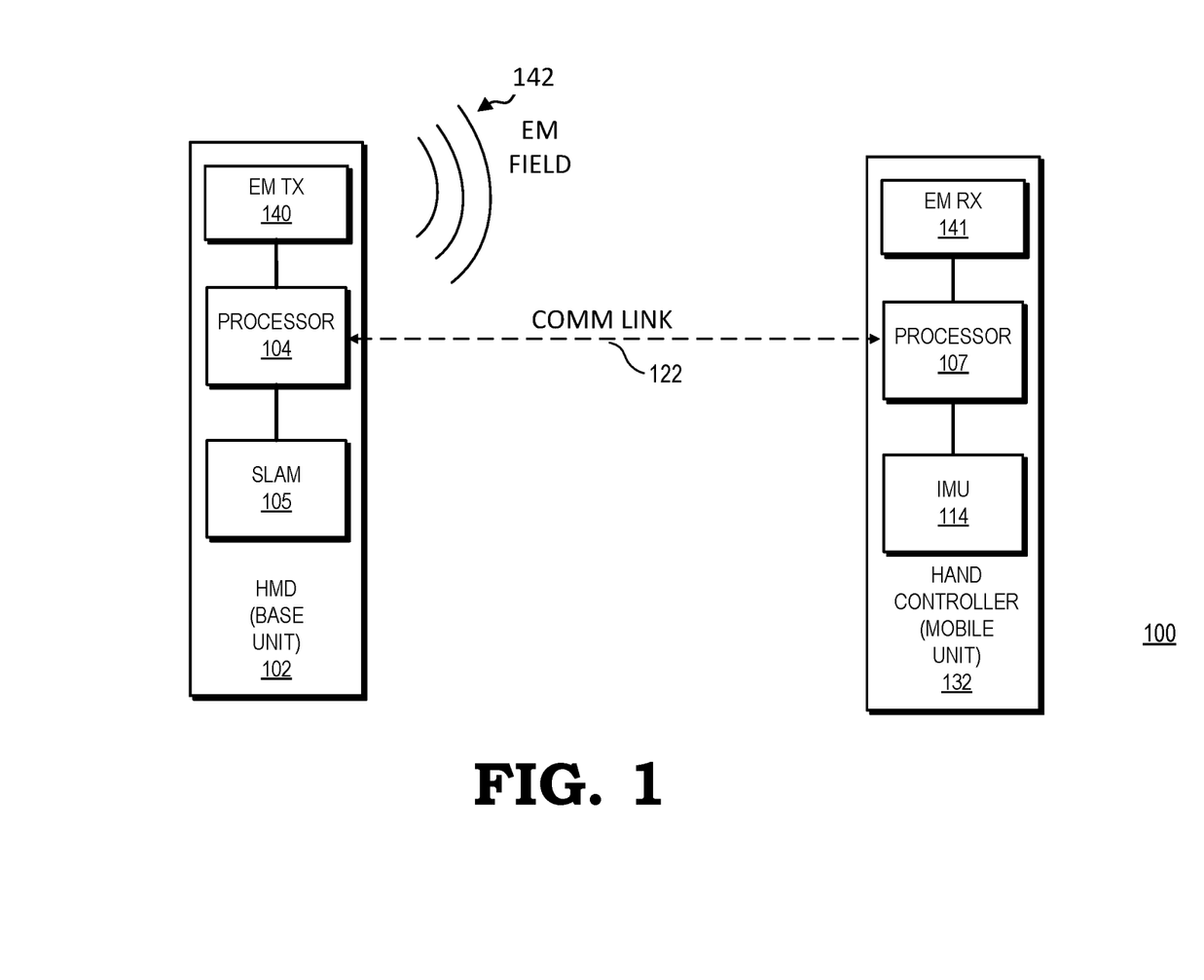
FIG. 1 is a diagram illustrating a head-mounted display (HMD) system utilizing an EM tracking system employing distortion correction in accordance with some embodiments.

FIG. 1 is a block diagram illustrating a head-mounted display (HMD) system 100 utilizing an EM position tracking system and an inertial measurement unit (IMU) for calculating a pose of a mounted unit in accordance with some embodiments. The HMD-based system 100 includes a HMD device 102, and one or more wired or wireless hand controllers 132. In at least one embodiment, the HMD device 102 includes a housing (not shown) to mount on a head of a user. The housing contains various electronic and optical components used to display visual content to the user, output audio content to the user, and track the pose of the hand controllers 132 as described further herein. The HMD device 102 can also include one or more near-eye displays, and a processing subsystem.

As a general overview of the operation of the HMD-based system 100, the HMD device 102 includes a processor 104 that executes instructions to provide a virtual reality (VR) experience to a user. For example, the processor 104 can execute instructions to display visual content via the one or more near-eye displays and output audio content via one or more speakers (not shown). To support provision of the VR experience, the HMD device 106 keeps track of its own pose within an environment of the HMD-based system 100. As used herein, the term "pose" refers to the position of an object, the orientation of the object, or a combination thereof. Thus, the HMD device can keep track of its position within the environment, can keep track of its orientation within the environment, or can keep track of both its position and its orientation.

To keep track of its pose within the environment, the HMD device 102 employs a simultaneous localization and mapping (SLAM) module 105, which is configured to generate pose information for the HMD device 102 based on SLAM techniques. For example, in some embodiments the SLAM module 105 is configured to receive imagery of the environment from one or more image capturing devices (not shown at FIG. 1), identify features from those images, and to identify the pose of the HMD device 102 based on the identified features. In at least one embodiment, the SLAM module 105 can employ additional pose detection sensors, such as inertial sensors, global positioning system sensors, and the like, to assist in identifying the pose of the HMD device 102. The SLAM module 105 provides the pose information to the processor 104, which in turn employs the pose information to place the HMD device 102 in a virtual environment.

To further enhance the VR experience, the HMD device 100 also continuously updates the pose of the hand controller 132. In particular, to identify the pose, HMD-based system 100 utilizes an EM field detection system including an EM field transmitter 140 to generate an EM field 142 and an EM field receiver 141 to detect a strength of the EM field 142. In the depicted example, the EM field transmitter 140 is located at or within a housing of the HMD device 102 and the EM field receiver 141 is located at or within a housing of the hand controller 132. However, because the EM field detection system is generally configured to generate a relative pose between transmitter 140 and the receiver 141, other configurations are possible. For example, in at least one embodiment the EM field transmitter 140 is located at or within a housing of the hand controller 132 and the EM field receiver 141 is located at or within a housing of the HMD device 102. In another embodiment, both the HMD 102 and the hand controller 132 contain EM field receivers while the EM transmitter is located in a third base unit. In yet another embodiment, the HMD 102 and hand controller 132 contain EM transmitters, while the EM receiver is located in a third base unit.

In the illustrated example, the hand controller 132 includes an IMU 114 to assist in position detection for the hand controller 132. In particular, the IMU 114 periodically or continuously generates pose information for the hand controller 132 based on one or more motion sensors of the IMU 114, such as one or more accelerometers, gyroscopes, or a combination thereof. A processor 107 of the hand controller 132 combines pose data generated by the IMU 114 (hereinafter, the "IMU pose data") and pose data generated based on the EM field 142 (hereinafter, the "EM pose data") to generate a combined pose and provides the combined pose to the HMD device 102 via a communication link 122. The HMD device 102 can employ the combined pose to identify the pose of the hand controller 132 relative to the HMD device 102 and make changes to the virtual environment based on the combined pose. This allows a user to interact with the virtual environment using the hand controller 132.

In at least one embodiment, the processor 107 combines the IMU pose data and the EM pose data by multiplying each type of data with a different weight and then adding the results of the multiplication. Further, in order to correct for detected distortion in the EM field 102, the processor 107 can change the weight applied to the IMU pose data, the weight applied to the EM pose data, or change both weights. To illustrate, in the absence of detected distortion in the EM field 142, the processor 107 applies a set of nominal weights to each of the IMU pose data and the EM pose data, and combines the results to generate the combined pose. In at least one embodiment, the applied weights are such that the IMU pose data has relatively little influence on the combined pose (e.g., the weight applied to the IMU pose data is close to or at zero). In response to detecting distortion in the EM field 142 as described further below, the processor 107 changes the weights applied to each of the IMU pose data and the EM pose data to increase the influence of the IMU pose data and decrease the influence of the EM pose data on the combined pose. The processor 107 thereby reduces the effect of the detected distortion on the identified pose of the hand controller 132, thereby improving the user experience. In one embodiment, the weight applied to the EM pose data are decreased when distortion is detected. In one specific embodiment, the weights applied to the EM pose is set to zero when the magnitude of detected distortion surpasses a threshold.

The processor 107 can detect distortion in the EM field 142 in any of a number of ways. For example, in one embodiment the processor 107 periodically compares IMU pose data to EM pose data. If the IMU pose data differs from the EM pose data by more than a threshold amount, the processor 107 determines that there is distortion in the EM field 142 resulting from, for example, a metal object that was not present during calibration of the HMD-based system 100. In another embodiment, the processor 107 calculates the EM pose data according to conventional techniques that employ one or more intermediate values in the calculation. These intermediate values tend to change proportionally with distortion. Accordingly, the processor 107 can detect EM distortion based on changes in these intermediate values, such as based on whether one or more of the intermediate values exceeds a threshold. In another embodiment the system 100 includes a magnetometer that generates magnetic readings of the environment, and the processor 107 can therefore detect likely distortions in the EM field 142 based on the magnetometer readings.

Figure 2:
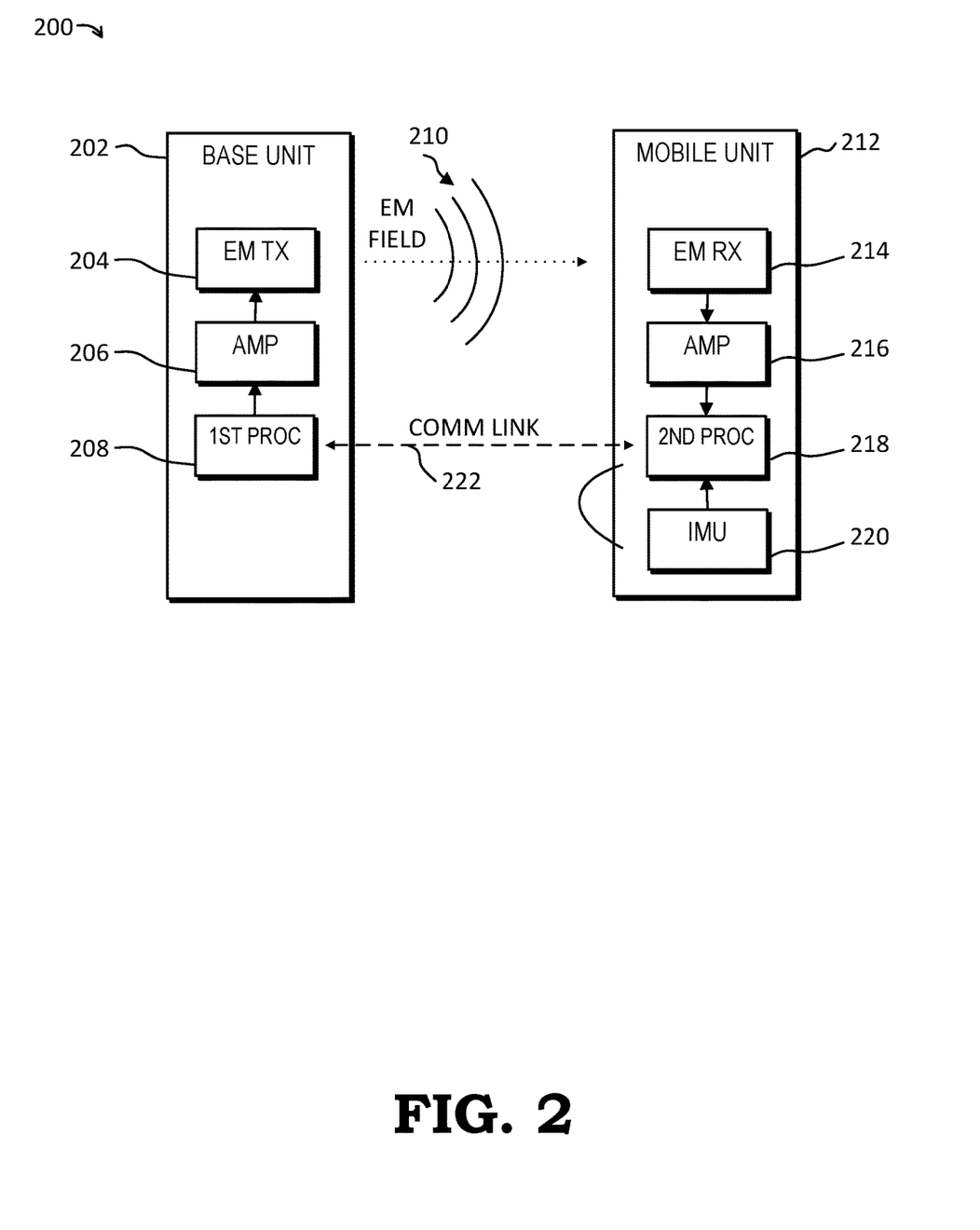
FIG. 2 is a block diagram illustrating an EM position tracking system that includes a base unit generating an EM field for use by a mobile unit in accordance with some embodiments.

FIG. 2 is a block diagram illustrating an EM position tracking system 200 that includes a base unit 202 generating an EM field 210 for use by a mobile unit 212 in accordance with some embodiments. EM position tracking system 200 can be employed in at least one embodiment of HMD-based system 100 as described in FIG. 1. Other embodiments are possible and are not limited by this disclosure. In the following embodiment, base unit 202 corresponds to the HMD device 102 of FIG. 1, while mobile unit 212 corresponds to the hand controllers 132, 134 of FIG. 1 in more detail. The EM position tracking system 200 is used to determine the pose of the mobile unit 212 in relation to the base unit 202 in accordance with some embodiments. In at least one embodiment, EM position tracking system 200 includes a HMD for AR or VR applications, such as the HMD device 102 of FIG. 1. In FIG. 2, base unit 202 includes an EM field transmitter 204, a power amplifier 206, and a first processor 208. The mobile unit 212 includes an EM field receiver 214, a signal amplifier 216, a second processor 218, and an IMU 220. The base unit 202 establishes communications with the mobile unit 212 by a communications link 222. The communications link 222 can be, but is not limited to, a wireless network link, a RF radio link, an IR light link, or other commercially-available methods suitable for wireless communications as described in FIG. 1. The communications link 222 allows the base unit 202 to send and receive data to and from the mobile unit 212. The data includes, but is not limited to, pose values from the base unit 202 or the mobile unit 212, corrected pose data to and from the base unit 202 to the mobile unit 212.

In the present embodiment, the base unit 202 generates the EM field 210 to be received by the mobile unit 212 as represented by the hand controllers 132, 134. The base unit 202 includes a first processor 208 to control the communications link 222 and execute instructions for other external elements of the EM position tracking system 200 such as data retrieval, storage, image generation, etc. as requested by the system. The mobile unit 212 is located within the EM field 210 where the relative magnitudes of the field is sensed by the EM receiver 214. As the mobile unit 212, representing the hand controllers 132, 134, moves around and within the EM field 210, a set of EM field magnitude values are generated by the EM receiver 214. These values are constantly changing in both magnitude and direction in three dimensions as the mobile unit 212 changes pose within the EM field 210. The mobile unit 212 can include a second processor 218 to perform calculations on the EM field magnitude values to generate EM pose data. Alternatively, the mobile unit 212 can send the EM field magnitude values to the base unit 202 for computation there. In yet another embodiment, the base unit 202 and the mobile unit 212 can share computation tasks as needed or assigned based on processor tasking, time-shared procedures, or the like as requested at the time the calculations are made.

Base unit 202 is positioned at a known location in the system environment. In one or more embodiments, base unit 202 establishes a relative position to the environment by employing sensors (not shown) to sense its own location and establishing that location as a baseline location. The sensors may be internal to the base unit 202 or, in alternative embodiments, be part of an external alignment procedure or tool to align and calibrate the base unit 202 to a known pose at system start-up. In the present embodiment, the power amplifier 206 receives a transmit signal from the first processor 208 and sends electrical power to the EM field transmitter 204 for use in generating the EM field 210. The transmit signal enables the power amplifier 206 to begin generating the EM field 210 for use by the mobile unit 212. The power amplifier 206 can be located within the base unit 202, or be remotely located within the EM position tracking system 200 environment. The EM field transmitter 204 can use a tri-axis coil or other device to generate a uniform 3-dimensional EM field that transits into the environment that includes the mobile unit 212.

The pose values for the base unit 202 and the mobile unit 212 are initially calibrated at system start-up to account for local disturbances in the environment caused by, but not limited to, metal found in the environment, metal in the base unit 202 or the components within, or other known influences that affect the uniformity of the generated EM field 210, including building materials, furniture, light fixtures, computers, etc. In some embodiments, the initial calibration is done by placing the mobile unit 212 in a known pose relative to the base unit 202 and having the EM position tracking system 200 compare the measured pose values to the expected pose values, and applying an error correction procedure to compensate for any differences between the two pose values. During this procedure, the effects of any metallic objects in the environment that cause distortions in the EM field 210 would be sensed and the pose valued adjusted as needed to meet system accuracy thresholds. The results of the calibration procedure are stored in a lookup table or applied to a fitted function to correct the pose data of both the base unit 202 and the mobile unit 212 as they are positioned at system start-up. By using this approach, known metal present in and near the environment is identified and compensated for. Meanwhile, in at least some embodiments, the first processor 208 or the second processor 218 can store data, including, but not limited to, pose data, lookup table data, calibration data, etc. recorded over time as described herein.

The mobile unit 212 is positioned within the EM field 210 and senses the relative field magnitudes of the EM field 210 a distance away from the base unit 202 using the EM receiver 214 to detect EM field magnitudes and generates pose values. Within the mobile unit 212, the EM field receiver 214 senses the EM field 210 and identifies EM magnitude values which are sent to the signal amplifier 216. The signal amplifier 216 enhances the EM magnitude values as required for use by the second processor 218. In at least some embodiments, the signal amplifier 216 can also function as an electrical filter for the incoming EM magnitude values to further process and condition the EM magnitude values for use by the second processor 218. Also, in at least some embodiments, signal amplifier 216 can be employed as a noise isolation filter and a level-shifting device for the incoming EM magnitude values. The second processor 218 receives the EM magnitude values and converts them into a set of pose values based on the EM field 210 magnitude values sensed by the mobile unit 212. The set of pose values based on the EM field is called the "EM pose values".

The mobile unit 212 also employs a second sensing unit in determining pose in the form of the IMU 220. The IMU 220 is positioned on or in mechanical contact with a known displacement with the mobile unit 212 to gather pose data. The IMU 220 can include, but is not limited to, an accelerometer, a gyroscope, a magnetometer, or other inertial-type sensors, or a GPS sensor. In the present embodiment, the IMU 220 includes an accelerometer and a gyroscope. Once initialized, the IMU 220 sends pose data to the second processor 218. In at least some applications, the IMU 220 generates IMU-generated pose data directly compatible for use by the second processor 218. This data includes the IMU-generated pose data or "IMU pose values". In other embodiments, the IMU pose values from the IMU 220 may require filtering and conversion to be used by the second processor 218. However, in at least some embodiments, IMU 220 provides IMU pose values directly to the second processor 218 to be used to detect for distortion and to determine the IMU pose values for the mobile unit 212 in relation to the base unit 202.

In some embodiments, one of the limitations of employing the IMU 220 is the characteristic of "drift" in the gyroscope. Left uncorrected, the drift creates errors in the data. Furthermore, the errors will accumulate over time and create an increasing deviation between the measured pose and the actual pose of the mobile unit 212. To maintain the accuracy of the IMU 220, first processor 208 can periodically align the sensors of the IMU 220 such that the IMU pose matches the EM pose. Finally, the communications link 222 connecting the base unit 202 and the mobile unit 212 is used to send signals to and from the base unit 202 first processor 208 and the mobile unit 212 second processor 218 to exchange pose data, data involved with the HMD, VR, or AR system, alignment signals, etc. as required.

In some embodiments, the signals being generated by the mobile unit 212, namely the "EM pose data" and the "IMU pose data" can each include some error caused by a variety of sources, including drift, interruptions in the EM field 210, an improperly-conducted start-up sequence, the presence of metallic objects near the EM field 210, or other internal and external influences in the environment. In at least some embodiments, the "EM pose" is accurate while the "IMU pose" is inaccurate. Alternatively, the "IMU pose" is accurate while the "EM pose" is inaccurate. Also, both values can be inaccurate, and for the same or different reasons. Accordingly, it is desirable to detect the magnitude of distortion when it occurs, and to determine the extent of the distortion in order to ensure the best possible accuracy of the EM position tracking system 200.

In the embodiment of FIG. 2, the detection of the magnitude of distortion is accomplished by processor 218 located in the mobile unit 212 comparing the EM pose values with the IMU pose values. Detection can be calculated by a process operating on one of the first processor 208 or the second processor 218. In one or more embodiments, the detection process is performed by the first processor 208 as follows: If the two values (EM pose and IMU pose) are within a predetermined range of each other (for example, within 2%), the first processor 208 concludes that the magnitude of distortion is negligible, that there is no metallic object in the environment affecting the readings, and that the EM pose values are correct. In such a scenario, the first processor 208 uses a nominal set of weights to weight the EM pose values and IMU pose values to determine the corrected values of pose for the mobile unit 212. If, however, there is a mismatch between the EM pose values and the IMU pose values that is larger than a predetermined threshold (or distortion in the EM field 210 is otherwise detected), the first processor 208 or the second processor 218 concludes that the EM field 210 is distorted due to an unknown metallic object in or near the field. In such a scenario, the first processor 208 or the second processor 218 changes the weights applied to the EM pose values and to the IMU pose values.

Figure 3:
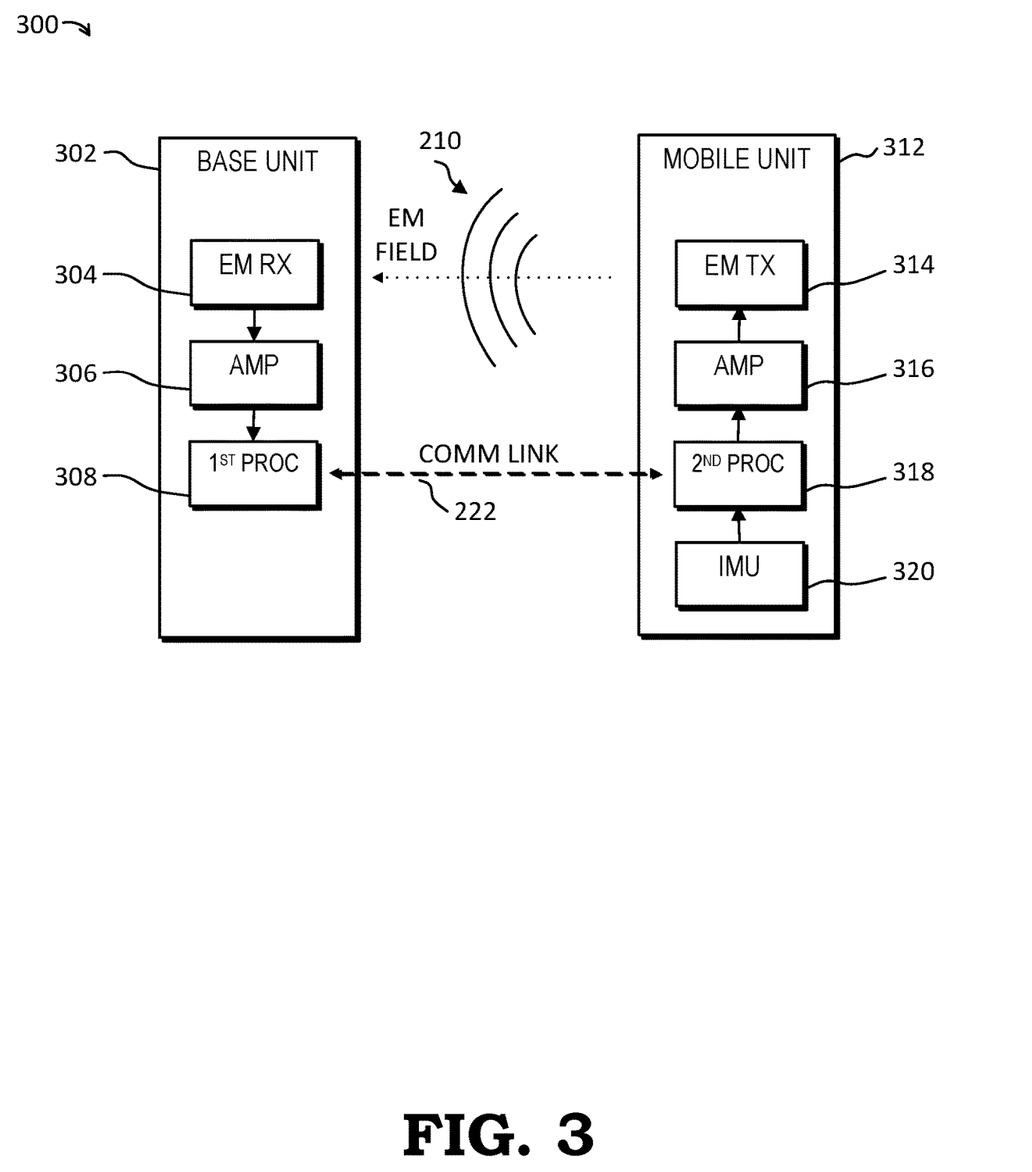
FIG. 3 is a block diagram illustrating an EM position tracking system that includes a mobile unit generating an EM field and a base unit in accordance with some embodiments.

FIG. 3 is a block diagram illustrating an EM position tracking system 300 that includes a mobile unit 312 generating the EM field 210 and a base unit 302. EM position tracking system 300 is but one embodiment of HMD-based system 100 as described in FIG. 1. Other embodiments are possible and are not limited by this disclosure. FIG. 3 shows a similar system as FIG. 2, but while FIG. 2 illustrates a base unit 202 generating the EM field 210 and being received by the mobile unit 212, FIG. 3 illustrates an alternative environment where the mobile unit 312 generates the EM field 210 and is received by the base unit 302. In this embodiment, the base unit 302 employs an EM field receiver 304, a signal amplifier 306, and a first processor 308. The mobile unit 312 includes an EM field transmitter 314, a power amplifier 316, a second processor 318, and an IMU 320. The IMU alignment signal 224 is also present, being generated by either the base unit 302 first processor 308 or the mobile unit 312 second processor 318.

Base unit 302 is positioned at a known location in the system environment. In one or more embodiments, base unit 302 establishes a relative position to the mobile unit 312 by employing sensors (not shown) to sense its own location and establishing that location as a baseline location. The sensors may be internal to the base unit 302 or, in alternative embodiments, be part of an external alignment procedure or tool to align and calibrate the base unit 302 to a known pose at system start-up. In the present embodiment, the power amplifier 316 receives a transmit signal from the second processor 318 and sends electrical power to the EM field transmitter 314 for use in generating the EM field 210. The transmit signal enables the power amplifier 316 to begin generating the EM field 210 for use by the base unit 302. The power amplifier 316 can be located within the mobile unit 312, or be remotely located within the EM position tracking system 300 environment. The EM field transmitter 314 can use a tri-axis coil or other device to generate a uniform 3-dimensional EM field that transits into the environment that includes the base unit 302.

The pose values for the base unit 302 and the mobile unit 312 are initially calibrated at system start-up to account for local disturbances in the environment caused by, but not limited to, metal found in the environment, metal in the base unit 302 or the components within, or other known influences that affect the uniformity of the generated EM field 210, including building materials, furniture, light fixtures, computers, etc. In some embodiments, the initial calibration is done by placing the mobile unit 312 in a known pose relative to the base unit 302 and having the EM position tracking system 300 compare the measured pose values to the expected pose values, and applying an error correction procedure to compensate for any differences between the two pose values. During this procedure, the effects of any metallic objects in the environment that cause distortions in the EM field 210 would be sensed and the pose valued adjusted as needed to meet system accuracy thresholds. The results of the calibration procedure are stored in a lookup table or applied to a fitted function to correct the pose data of both the base unit 302 and the mobile unit 312 as they are positioned at system start-up. By using this approach, known metal present in and near the environment is identified and compensated for. Meanwhile, in at least some embodiments, the first processor 308 or the second processor 318 can store data, including, but not limited to, pose data, lookup table data, calibration data, etc. recorded over time as described herein.

The base unit 302 is positioned within the EM field 210 and senses the relative field magnitudes of the EM field 210 a distance away from the mobile unit 312 using sensors that detect EM field magnitudes and generates pose values. Within the base unit 302, the EM field receiver 304 senses the EM field 210 and identifies EM magnitude values which are sent to the signal amplifier 306. The signal amplifier 306 enhances the EM magnitude values as required for use by the first processor 308 or the second processor 318. In at least some embodiments, the signal amplifier 306 can also function as an electrical filter for the incoming EM magnitude values to further process and condition the EM magnitude values for use by the first processor 308 or the second processor 318. Also, in at least some embodiments, signal amplifier 306 can be employed as a noise isolation filter and a level-shifting device for the incoming EM magnitude values. The first processor 308 or the second processor 318 receives the EM magnitude values and converts them into a set of pose values based on the EM field 210 magnitude values sensed by the base unit 302. The set of pose values based on the EM field is called the "EM pose values".

The mobile unit 312 also employs a second sensing unit in determining pose in the form of the IMU 320. The IMU 320 is positioned on or in mechanical contact with a known displacement with the mobile unit 312 to gather pose data. The IMU 320 can include, but is not limited to, an accelerometer, a gyroscope, a magnetometer, or other inertial-type sensors, or a GPS sensor. In the present embodiment, the IMU 320 includes an accelerometer and a gyroscope. Once initialized, the IMU 320 sends pose data to the second processor 318. In at least some applications, the IMU 320 generates IMU-generated pose data directly compatible for use by the second processor 318. This data includes the IMU-generated pose data or "IMU pose values". In other embodiments, the IMU pose values from the IMU 320 may require filtering and conversion to be used by the second processor 318. However, in the present embodiment, IMU 320 provides IMU pose values directly to the second processor 318 to be used to detect for distortion and to determine the corrected pose for the mobile unit 312 in relation to the base unit 302.

In at least some embodiments, EM position tracking system 300 is represented by the HMD system 100 as described in FIG. 1 with the mobile unit 312 represented by the hand controllers 132, 134 of FIG. 1. In the present embodiment, the mobile unit 312 generates the EM field 210 to be received by the base unit 302. In this embodiment, the mobile unit 312 includes an EM transmitter 314 that generates the EM field 210 and is received by the EM received 304 at the base unit 302. As the mobile unit 312 moves within the EM field 210, the base unit 302 receives varying magnitude values corresponding to the relative position of the mobile unit 312 to the base unit 302. The EM receiver 304 in the base unit 302 generates EM field magnitude values based on the relative magnitudes of the EM field 210 originating from the mobile unit 312 and sends this data to the signal amplifier 304 and the first processor 308 as an input for the first processor 308 to calculate the EM pose of the mobile unit 312. Alternatively, the base unit 302 can send the EM field magnitude values to the mobile unit 312 for computation there with the second processor 318. In yet another embodiment, the base unit 302 and the mobile unit 312 can share computation tasks as needed or assigned based on processor tasking, time-shared procedures, or the like as requested at the time the calculations are made.

In some embodiments, one of the limitations of employing the IMU 320 is the characteristic of "drift" in the gyroscope. Left uncorrected, the drift creates errors in the data. Furthermore, the errors will accumulate over time and create an increasing deviation between the measured pose and the actual pose of the base unit 302 and the mobile unit 312. To maintain the accuracy of the IMU 320, the IMU alignment signal 224 is sent by the first processor 308 of the base unit 302, or the second processor 318 of the mobile unit 312, to align the gyroscope inside the IMU 320 to a known state. Finally, the communications link 222 connecting the base unit 302 and the mobile unit 312 is used to send signals to and from the base unit 302 first processor 308 and the mobile unit 312 second processor 318 to exchange pose data, data involved with the HMD, VR, or AR system, alignment signals, etc. as required.

In some embodiments, the "IMU pose data" signal being generated by the mobile unit 312 and the "EM pose data" signal being generated by the base unit 302, can each include some error caused by a variety of sources, including drift, interruptions in the EM field 210, an improperly-conducted start-up sequence, the presence of metallic objects near the EM field 210, or other internal and external influences in the environment. In at least some embodiments, the "EM pose" is accurate while the "IMU pose" is inaccurate. Alternatively, the "IMU pose" is accurate while the "EM pose" is inaccurate. Also, both values can be inaccurate, and for the same or different reasons. Accordingly, it is desirable to detect the magnitude of distortion when it occurs, and to determine the extent of the distortion in order to ensure the best possible accuracy of the EM position tracking system 300.

In the embodiment of FIG. 3, detection of distortion is accomplished by processor 318 located in the mobile unit 312 comparing the EM pose values with the IMU pose values. Detection can be calculated by a process operating on one of the first processor 308 or the second processor 318. In one or more embodiments, the detection process is performed by the first processor 308 as follows: If the two values (EM pose and IMU pose) are within a predetermined range of each other (for example, within 2%), the first processor 308 concludes that the magnitude of distortion is negligible, that there is no metallic object in the environment affecting the readings, and that the EM pose values are correct. In such a scenario, the first processor 308 applies a nominal set of weights to the EM pose values and the EM pose values, and combines the weighted values to determine the corrected pose. If, however, there is a mismatch between the EM pose values and the IMU pose values over a predetermined threshold (or distortion is otherwise detected), the first processor 308 concludes that the EM field 210 is distorted due to an unknown metallic object in or near the field. In such a scenario, the first processor 308 changes the weights applied the EM pose values and the IMU pose values to increase the influence of the IMU pose values on the corrected pose.

Figure 4A:
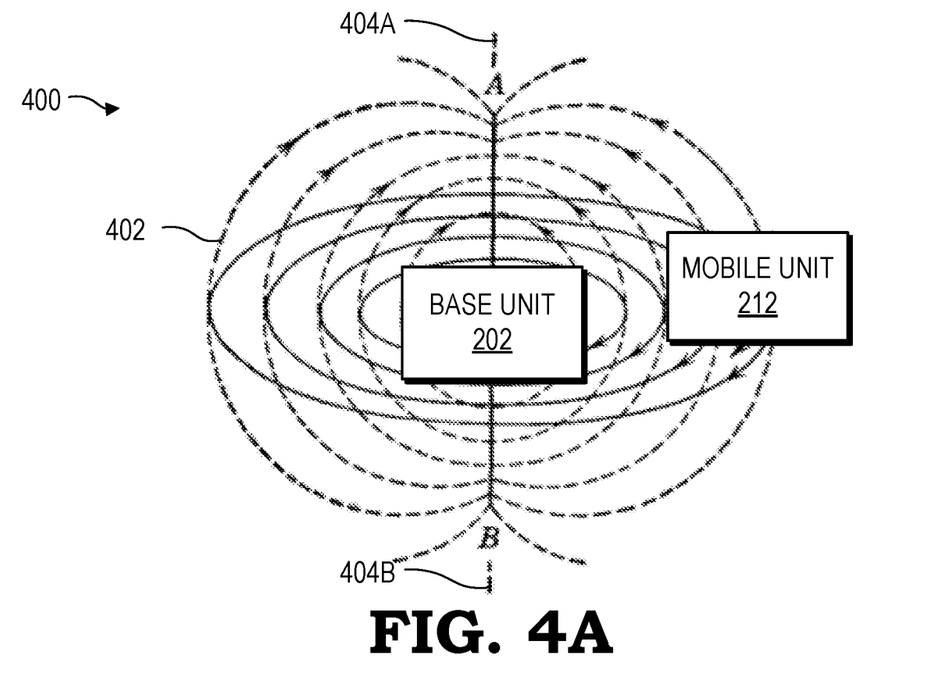
FIG. 4A is a diagram illustrating an EM field (without distortion) being generated by a base unit, with a mobile unit positioned inside the EM field in accordance with some embodiments.

FIG. 4A is a diagram illustrating a 3-dimensional EM field (without distortion) 400 being generated by a base unit 202 of FIG. 2, with a mobile unit 212 of FIG. 2 positioned inside the EM field 400 in accordance with some embodiments. In the illustrated embodiment, the base unit 202 generates a 3-dimensional spheroid EM field 402 for use in the EM position tracking system 200 as described in FIG. 2 above. The mobile unit 212 is positioned within the EM field 402, where it senses the EM field and generates a series of EM magnitude values for further analysis by the mobile unit 212. For a given distance away from magnetic poles 404A, 404B of the EM field 402, the field lines are uniformly curved, substantially parallel to each other, and roughly symmetrical along the vertical axis labeled A-B. In this embodiment, there are no distortions present to influence the symmetry or curvature of the field lines. Also in this embodiment, the resultant EM pose values as described in FIG. 2 would have no distortion or error as compared to the IMU pose data, and therefore the HMD-based system 100 would not correct or replace the EM pose data. Instead, the processor 318 would use the EM pose data as the correct pose data for the mobile unit 212.

In at least some embodiments, the EM field 400 environment as shown in FIG. 4A can be represented by an HMD system 100 of FIG. 1. The hand controller 132 of FIG. 1 is shown in FIG. 4A as mobile unit 212 residing within the EM field while the base unit 202 generates the EM field 402. In this embodiment, the EM field lines are uniform, relatively linear, and concentric. This leads to the HMD-based system 100 generating an EM pose value that is accurate and with no distortion when compared to the IMU pose values generated by the mobile unit 212 IMU pose sensor. Accordingly, the first processor 208 or the second processor 218 in either the base unit 202 or the mobile unit 212 will calculate a corrected pose value based exclusively on the EM pose values only, and will not use the IMU pose values. This is accomplished by assigning a weighted value of 1.0 for the EM pose values and a weighted value of 0.0 to the IMU pose values in a calculation process as described in FIG. 5. The processor 208, 218 will then use the corrected pose values to accurately determine the correct pose of the hand controllers 132, 134 and to generate the appropriate images for use by the HMD device 102 based on the accurate pose of the hand controllers 132, 134.

Figure 4B:
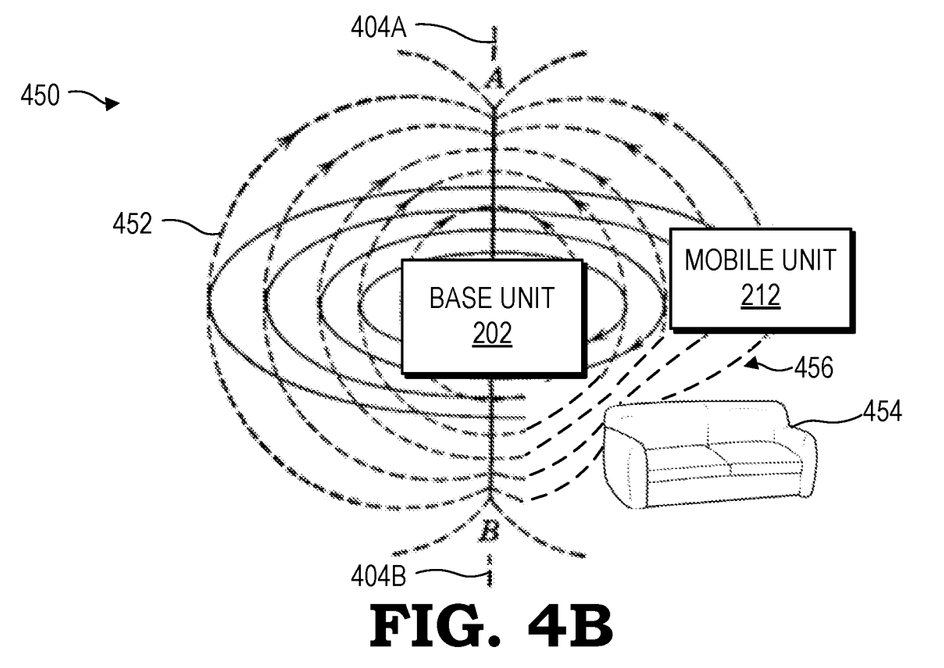
FIG. 4B is a diagram illustrating an EM field (with distortion) being generated by a base unit, with a mobile unit and a metallic object positioned inside the EM field in accordance with some embodiments.

FIG. 4B is a diagram illustrating a 3-dimensional EM field (with distortion) 450 being generated by a base unit 202, with a mobile unit 212 and a metallic object positioned inside the EM field 450 in accordance with some embodiments. In this embodiment, a metallic object (in this example, a couch 454 with a metal frame) has been placed in the environment after initial calibration of the EM position tracking system 200 of FIG. 2 upon start-up and is adversely affecting a distorted EM field 452. The presence of the couch 454 within the distorted EM field 452 creates distortions in the field lines, resulting in a distortion region 456. Distortion region 456 exhibits varied magnitude values and non-symmetric field lines as compared to other regions of the distorted EM field 452. Any attempts to use an EM position tracking system, such as the EM position tracking system 200 discussed in FIG. 2, to measure the pose of the mobile unit 212 will likely include distorted readings and resultant magnitude values, thus introducing distortion into the values. This distortion will result in inaccurate EM pose values for as long as the metallic object is in the environment.

In at least some embodiments, the EM field 450 environment as shown in FIG. 4B can be represented by an HMD system 100 of FIG. 1. The hand controllers 132, 134 are shown in FIG. 4A as mobile unit 212 residing within the EM field while the base unit 202 generates the EM field. In this embodiment, the EM field lines are distorted and non-concentric in a distortion region 456 around the metallic object 454. This leads to the HMD d-based system 100 generating an EM pose value that is inaccurate and does not match either the IMU pose values generated by the mobile unit 212 IMU pose sensor or the actual pose values of the mobile unit 212. The first processor 208 or the second processor 218 will compare the two pose values and determine that the magnitude of distortion is present when the two values do not match to a significant degree. Accordingly, the processor in either the mobile unit 212 or the base unit 202 will calculate a corrected pose value based both on the EM pose values and the IMU pose values. This is accomplished by assigning weighted values for the EM pose values and the IMU pose values in a calculation process as described in FIG. 5. The processor will then use the corrected pose values to accurately determine the correct pose of the hand controllers 132, 134 and to generate the appropriate images for use by the HMD device 102 based on the accurate pose of the hand controllers 132, 134.

Figure 5:
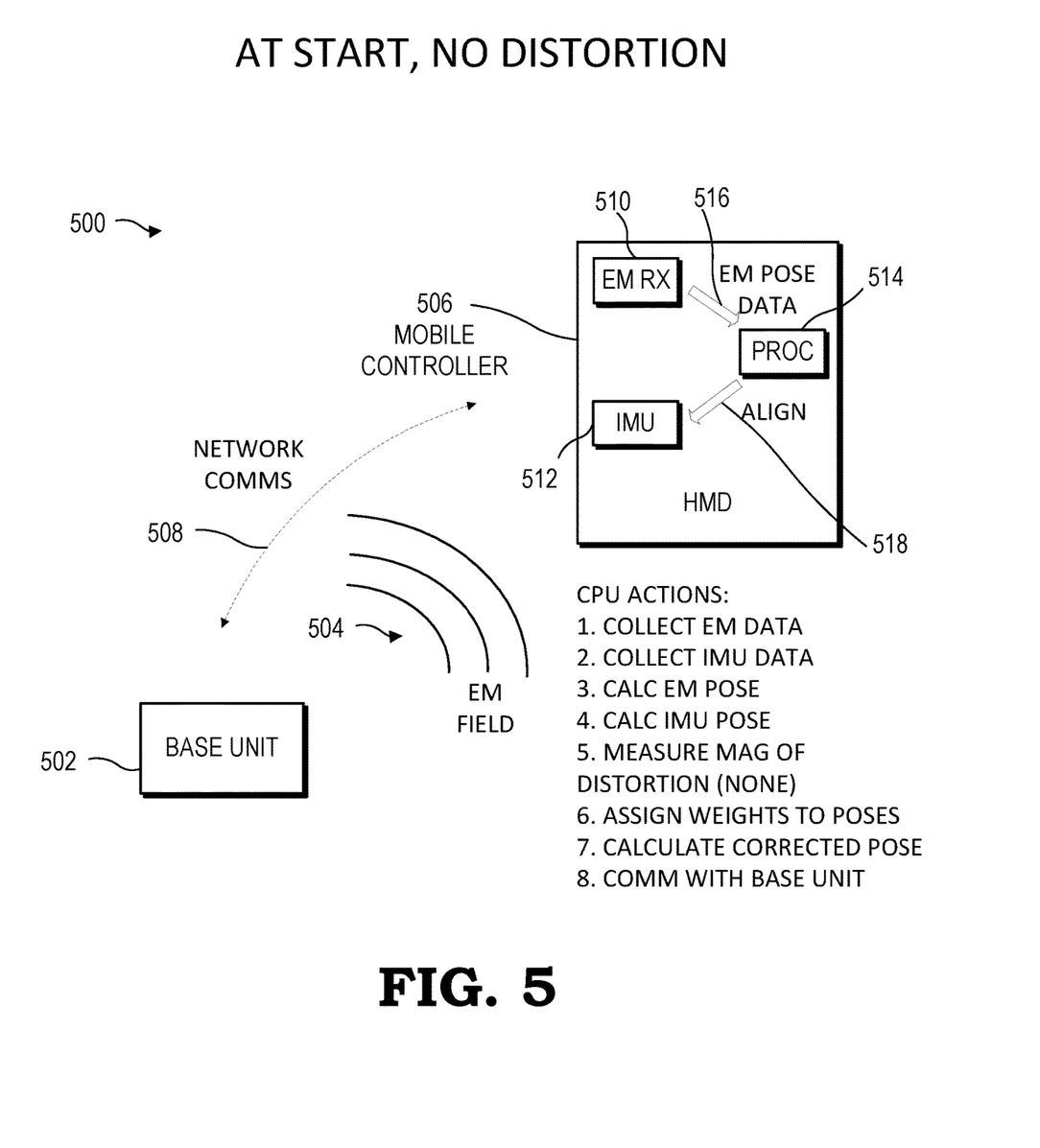
FIG. 5 is a system block diagram illustrating the HMD system of FIG. 1 using EM tracking (without distortion) in accordance with some embodiments.

FIG. 5 is a system block diagram illustrating the HMD system 100 of FIG. 1 using an EM tracking (without distortion) 500 in accordance with some embodiments. EM position tracking system 500 includes a base unit 502, an EM field 504, a mobile controller 506, and a wired or wireless network communications channel 508. The mobile controller 506 includes an EM field receiver 510, an IMU 512, a controller processor 514, EM pose values 516, and an IMU alignment signal 518. The base unit 502 generates the EM field 504 while the mobile controller 506 moves within the field. The EM field receiver 510 receives signals from the EM field 504 and sends EM pose values 516 to the controller processor 514 or the base unit 502 for analysis to calculate the EM pose values. In at least some embodiments, the information stays within the mobile controller 506 and is processed by the controller processor 514. In the present embodiment, the controller processor 514 is calculating the pose of the mobile controller 506. At approximately the same time, the IMU 512 is generating pose data using the gyroscope and accelerometer as described in FIG. 2, which is sent to the controller processor 514 in the form of IMU pose values.

The controller processor 514 executes a series of steps to calculate a final "corrected pose" value that is sent to the base unit 502 or used by the controller processor 514 in other operations. The steps include 1). collecting the EM pose data from the EM field receiver 510 and storing the information; 2). collecting the IMU pose data from the IMU 512; 3). calculating the EM pose value; 4). calculating the IMU pose value; 5). detect and measure the magnitude of distortion present; 6). assign different weights to the EM pose value and the IMU pose value; 7). calculate the corrected pose value using the different weights; and 8). send the corrected pose value to a processor for further analysis. In this example, as there is no distortion present or detected, the EM pose values 516 are used exclusively to calculate the "corrected pose" of the mobile controller 506, and the data from the IMU is ignored. This is done by assigning a weight of 1.0 to the EM pose values and a weight of 0.0 to the IMU pose values. The resultant corrected pose values will be calculated from the EM pose values exclusively.

Detection of distortion is accomplished by comparing the EM pose values with the IMU pose values. If the two values are within a predetermined range of each other (for example within 2%), the controller processor 514 concludes that the distortion is negligible, that there is no metallic object in the environment affecting the readings, and that the EM pose values are correct. In such a scenario, the controller processor 514 uses only the EM pose values to determine the corrected values. If, however, there is a mismatch between the EM pose values and the IMU pose values over a predetermined threshold, the controller processor 514 concludes that the EM field 504 is distorted due to an unknown metallic object in or near the field. In such a scenario, the controller processor 514 calculates the corrected pose values by augmenting the EM pose values with the IMU pose values, based upon the weights assigned to each value. Following is an example of changing the weights applied to the different pose values based on detected distortion.

$$[POSE_{CORRECTED}] = WEIGHT_{EM} * [POSE_{EM}] + WEIGHT_{IMU} * [POSE_{IMU}] \quad \text{(Eq. 1)}$$

where $WEIGHT_{EM}=0.0-1.0$; $WEIGHT_{IMU}=0.0-1.0$; and where $WEIGHT_{EM}+WEIGHT_{IMU}=1.0$
Example 1: where $WEIGHT_{EM}=0.25$ & $WEIGHT_{IMU}=0.75$;

$$POSE_{CORRECTED}=0.25*[POSE_{EM}]+0.75*[POSE_{IMU}]$$

Figure 6:
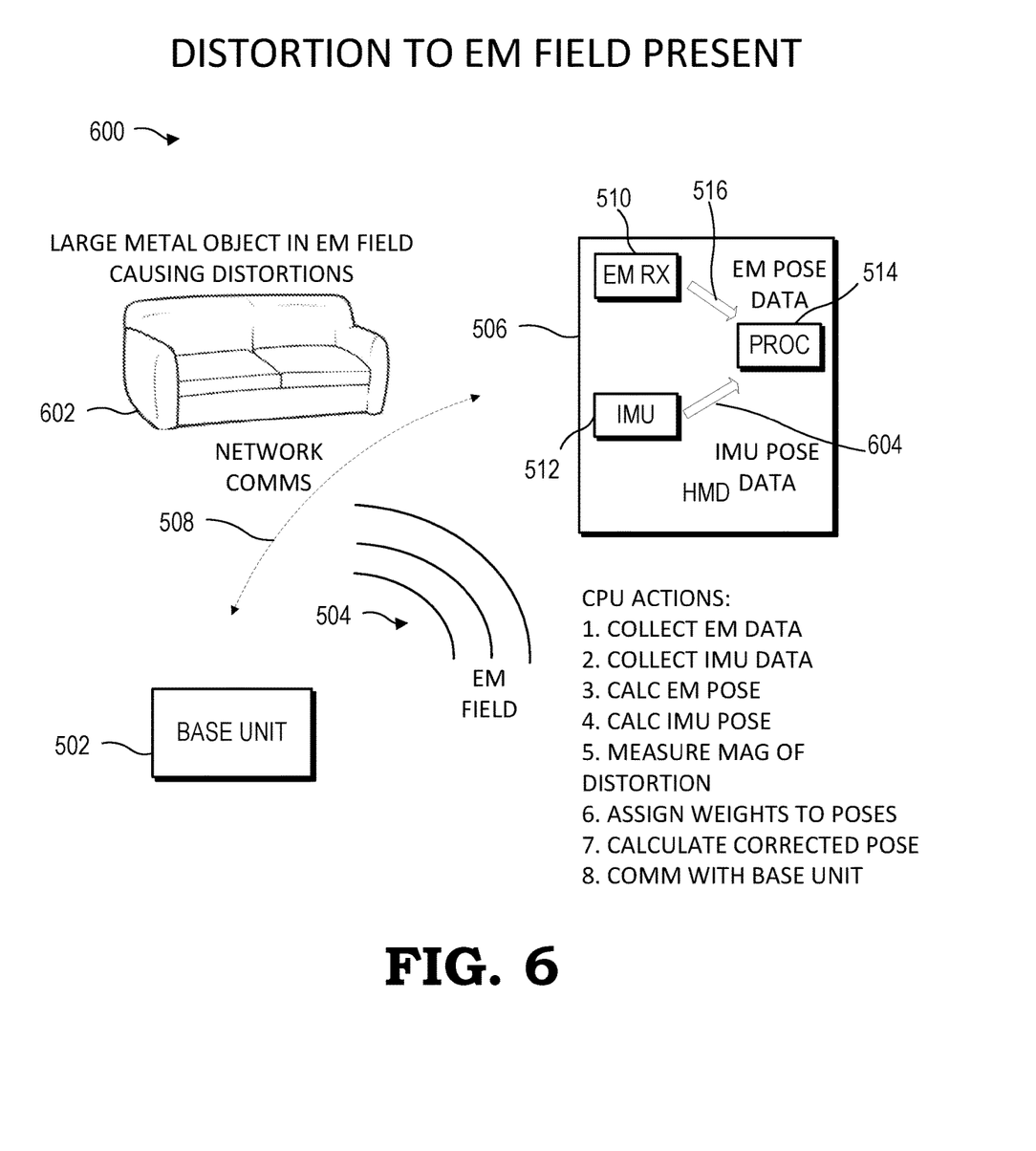
FIG. 6 is a system block diagram illustrating the HMD system of FIG. 1 using EM tracking (with distortion) in accordance with some embodiments.

FIG. 6 is a system block diagram illustrating the HMD system 100 of FIG. 1 using EM tracking (with distortion) 600 in accordance with some embodiments. This scenario is similar to the scenario discussed in FIG. 5, but with distortion present due to a metallic object present in the EM field 504. In the present embodiment, the metallic object is represented by a couch 602 containing a metal frame that affects the EM field 504. The controller processor 514 executes the same steps to process the pose data from both the EM field receiver 510 and the IMU 512. However, controller processor 514 detects the distortion and, in step 6 above, assigns weights to the EM pose data 516 and IMU pose data 604. The weights assigned to each set of data can be derived from a variety of methods, including but not limited to the magnitude of the differences between the two data sets, the length of time since the distortion was first detected, the length of time since the IMU 512 was last aligned, assigning an arbitrary weighting value, etc. Other methods to assign weighting values to the data sets are possible and are not limited by the discussion described herein. Once the weights have been assigned to the data sets, the controller processor 514 continues with the process by executing steps 7 (calculate the corrected pose value) and 8 (send the corrected pose value to a processor for further analysis).

Figure 7:
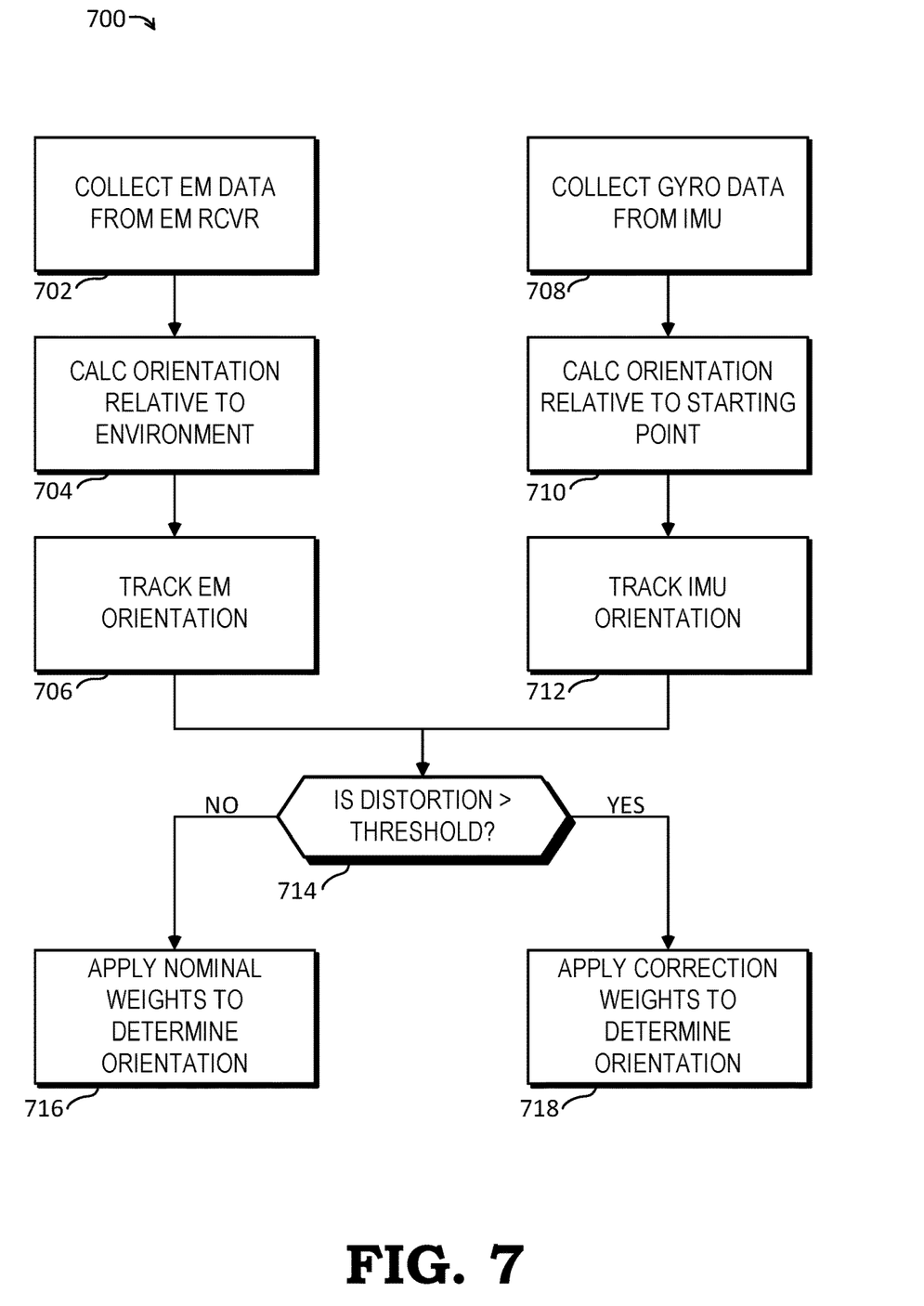
FIG. 7 is a flow diagram of a method of calculating the orientation of a HMD system of FIG. 1 using an EM position tracking system in accordance with some embodiments.

FIG. 7 is a flow diagram illustrating a method of calculating the orientation of a mobile unit 700 using an EM position tracking system in accordance with some embodiments. FIG. 7 discloses a process for calculating the orientation of a device while FIG. 8 disclosed a process for calculating the position of a device, such as a hand controller 132, 134 of FIG. 1 as described in the EM position tracking system 100 of FIG. 1. Orientation process 700 includes the mobile unit 212 collecting EM data from the EM receiver at block 702, a first processor 208 (located in the base unit 202 of FIG. 2) or a second processor 218 (located in the mobile unit 212 of FIG. 2) calculating the EM orientation relative to the environment at block 704, the first processor 208 or the second processor 218 tracking the EM orientation at block 706, the mobile unit 212 collecting accelerometer and gyroscopic data from the IMU at block 708, the first processor 208 or the second processor 218 calculating the IMU orientation relative to a starting point at block 710, the first processor 208 or the second processor 218 tracking the IMU orientation at block 712, the first processor 208 or the second processor 218 determining whether distortion is present at block 714, the first processor 208 or the second processor 218 using the EM data to determine the corrected orientation at block 716, and the first processor 208 or the second processor 218 using a dead reckoning or a weighted sensor fusion process to determine orientation at block 718.

At block 702, the first processor 208 collects EM magnitude values from the EM receiver and send the data to the signal amplifier 216 (in mobile unit 212 of FIG. 2). The EM magnitude values also flows to the second processor 218. Next, at block 704, the first processor 208 or the second processor 218 receives the EM magnitude values and calculates a "EM orientation" value. At block 706, the first processor 208 or the second processor 218 tracks the EM orientation and stores the values periodically, for example, every 10 ms or every 1 ms, depending on the resolution required for that application. Meanwhile, while EM orientation values are being created and stored, a similar process is executed for data originating from the IMU 220. Additionally, at block 710, the second processor 218 calculates IMU orientation values from the gyroscope located within the IMU 220. The second processor 218 then uses the IMU orientation values to calculate an IMU orientation relative to a known starting point. Next at block 712, the second processor 218 tracks the IMU orientation and stores the values periodically, for example, every 10 ms or every 1 ms, depending on the resolution required for that application.

At decision block 714, the base unit 202 first processor 208 or the mobile unit 212 second processor 218 receives both the EM orientation values and the IMU orientation values and compares them. If the two values agree (e.g. a difference that is less than a predetermined threshold value), the first processor 208 or the second processor 218 determines that no distortion is present. If, however, the two values do not agree (e.g. a difference that is more than a predetermined threshold value), the process determines that distortion is present. Next, if first processor 208 or second processor 218 determines that distortion is not present, at block 716 the first processor 208 or the second processor 218 relabels the EM orientation as the corrected orientation and communicates the corrected orientation to the system for further use. At block 716, if the first processor 208 or the second processor 218 determines that distortion is not present, the processor applies a nominal specified set of weights to the EM orientation and the IMU orientation, respectively, and combines the weighted values to determine a corrected orientation for the unit.

At decision block 714, when the first processor 208 or the second processor 218 determines that distortion is present beyond a predetermined threshold value, it is assumed that the EM orientation values are in error. At block 718, the first processor 208 or the second processor 218 uses adjusted weights to weight the EM orientation values and the IMU orientation values respectively. In at least one embodiment, the processor determines the adjusted weights based at least in part on the magnitude of the differences between the EM pose values and the IMU pose values. In some embodiments, the processor determines the adjusted weights based at least in part from the duration of distortion sensed over time.

The orientation process 700 is cycled continuously to regularly track the position of the mobile unit 212 in relation to the base unit 202 as exemplified by the hand controllers 132, 134 in an EM position tracking system 100. Resolution of the system is determined by the cycle time of process 702. In at least some embodiments, a cycle time of 10 ms can correspond to a resolution of 1-2 mm or less, but other cycle times are possible and are not limited by this example. For applications using hand controllers 132, 134 or other VR or AR devices, determining a device's position within 1 mm and as fast as possible is highly desirable to avoid "choppy" or step-like motion as viewed through the HMD.

Figure 8:
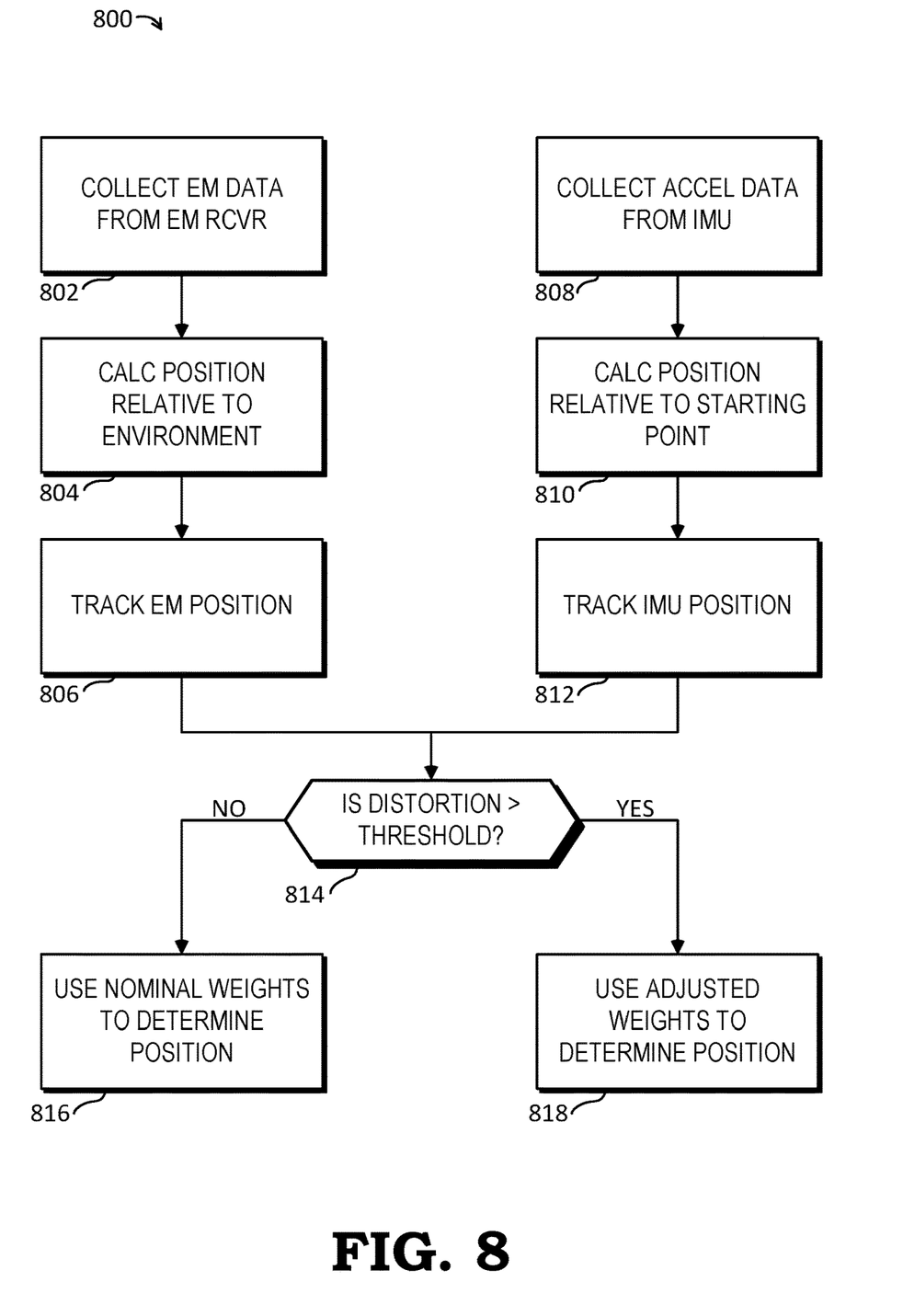
FIG. 8 is a flow diagram of a method of calculating the position of a HMD system of FIG. 1 using an EM position tracking system in accordance with some embodiments.

FIG. 8 is a flow diagram of a method of calculating the position of a mobile unit 800 using an EM position tracking system in accordance with some embodiments. In at least one embodiment, position process 800 includes the use of a mobile unit 212 in an EM position tracking system 100 as described herein. Position process 800 includes having a first processor 208 (located in the base unit 202 of FIG. 2) or a second processor 218 (located in the mobile unit 212 of FIG. 2) collecting EM data from the EM receiver at block 802, the first processor 208 or the second processor 218 calculating the EM position relative to the environment at block 804, the first processor 208 or the second processor 218 tracking the EM position at block 806, the first processor 208 or the second processor 218 collecting accelerometer data from the IMU at block 808, the first processor 208 or the second processor 218 calculating the IMU position relative to a starting point at block 810, the first processor 208 or the second processor 218 tracking the IMU position at block 812, the first processor 208 or the second processor 218 determining whether distortion is present at block 814, the first processor 208 or the second processor 218 using the EM data to determine the corrected position at block 816, and the first processor 208 or the second processor 218 using a dead reckoning or a weighted fusion process to determine position at block 818. Additionally, there is an IMU alignment signal 820 generated by the first processor 208 or the second processor 218. FIG. 8 is identical to the process for calculating the orientation of a device as shown in FIG. 7, except that instead of orientation, the process tracks the position of a device, such as a HMD as described in the EM position tracking system 100 of FIG. 1. Also, instead of the IMU 220 using a gyroscope to generate orientation values, an accelerometer is used to generate position values using dead reckoning techniques.

At block 802, the first processor 208 collects EM magnitude values from the EM receiver and send the data to the signal amplifier 216 (in mobile unit 212 of FIG. 2). The EM magnitude values also flows to the second processor 218. Next, at block 804, the first processor 208 or the second processor 218 receives the EM magnitude values and calculates a "EM position" value. At block 806, the first processor 208 or the second processor 218 tracks the EM position and stores the values periodically, for example, every 10 ms or every 1 ms, depending on the resolution required for that particular application. Meanwhile, while EM position values are being created and stored, a similar process is executed for data originating from the IMU 220. At block 810, the mobile unit 212 IMU 220 is aligned. Additionally, at block 810, the second processor 218 calculates IMU position values from the gyroscope located within the IMU 220. The second processor 218 then uses the IMU position values to calculate an IMU position relative to a known starting point. Next at block 812, the second processor 218 tracks the IMU position and stores the values periodically, for example, every 10 ms or every 1 ms, depending on the resolution required for that application.

At decision block 814, the base unit 202 first processor 208 or the mobile unit 212 second processor 218 receives both the EM position values and the IMU position values and compares them. If the two values agree (e.g. a difference that is less than a predetermined threshold value), the first processor 208 or the second processor 218 determines that no distortion is present. If, however, the two values do not agree (e.g. a difference that is more than a predetermined threshold value), the process determines that distortion is present. Next, if first processor 208 or second processor 218 determines that distortion is not present, at block 816 the first processor 208 or the second processor 218 applies nominal corresponding weights to the EM position values and the IMU position values, respectively, and combines the weighted values to determine a corrected position for the unit.

At decision block 814, when the first processor 208 or the second processor 218 determines that distortion is present beyond a predetermined threshold value, it is assumed that the EM position values are in error. At block 818, the first processor 208 or the second processor 218 adjusts the weights applied to the EM position values and to the IMU position values to increase the influence of the IMU position values on the corrected position.

In at least one embodiment, the processor calculates the weighted values based at least in part on the magnitude of the differences between the EM pose values and the IMU pose values. In some embodiments, the weighted values can be calculated from the duration of distortion sensed over time. Additional details concerning the weighted values are found in the discussion of FIG. 5. The position process 800 is cycled continuously to regularly track the position of the mobile unit 212 in relation to the base unit 202 as exemplified by a HMD device 102 in an EM position tracking system 100. Resolution of the system is determined by the cycle time of process 802. In at least some embodiments, a cycle time of 10 ms can correspond to a resolution of 1-2 mm or less, but other cycle times are possible and are not limited by this example. For applications using hand controllers 132, 134 or other VR or AR devices, determining a device's position within 1 mm and as fast as possible is highly desirable to avoid "choppy" or step-like motion as viewed through the HMD.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   receiving, from an electromagnetic (EM) position tracking system, EM field magnitude values indicative of a first pose of a transmitter in relation to a receiver, wherein the EM position tracking system comprises the transmitter and the receiver;
   receiving, from a first pose sensor associated with a portion of the EM position tracking system comprising one of the receiver and the transmitter, sensor data indicative of the first pose, wherein the portion of the EM position tracking system and the first pose sensor are located on or within a housing together;

in response to detecting that a magnitude of a first distortion of the EM field exceeds a distortion threshold, calculating a corrected pose based on a combination of the EM field magnitude values and the sensor data;

sending the corrected pose to a processor;

subsequent to sending the corrected pose to the processor, receiving EM field magnitude values and sensor data indicative of a second pose of the transmitter;

in response to detecting that a magnitude of a second distortion does not exceed the distortion threshold, sending the second pose identified by the EM field magnitude values indicative of the second pose to the processor; and calibrating the first pose sensor based on the EM field magnitude values indicative of the second pose.

2. The method of claim 1, wherein a base unit comprises the transmitter.

3. The method of claim 2, wherein the base unit comprises a head-mounted display device.

4. The method of claim 1, wherein a mobile unit comprises the transmitter.

5. The method of claim 1, wherein a base unit comprises the receiver.

6. The method of claim 1, wherein a mobile unit comprises the receiver.

7. The method of claim 1, wherein calculating a corrected pose comprises changing weights applied to an EM pose generated based on the EM field magnitude values and a sensor pose generated based on the sensor data.

8. The method of claim 1, further comprising detecting distortion based on differences in poses indicated by the EM field magnitude values and the sensor data.

9. The method of claim 1, wherein the first pose sensor comprises at least one of a gyroscope and an accelerometer.

10. A method comprising:
calculating a first pose of a mobile unit in relation to a base unit based on EM field magnitude values;
calculating a second pose of the mobile unit in relation to the base unit based on sensor data from a first pose sensor associated with the mobile unit,
detecting a first distortion of the EM field;
calculating a corrected pose based on the detected first distortion, the first pose, and the second pose;
sending the corrected pose to a processor;
subsequent to sending the corrected pose to the processor, receiving EM field magnitude values and sensor data indicative of a third pose of the mobile unit;
in response to detecting that a magnitude of a second distortion does not exceed a distortion threshold, sending the third pose identified by the EM field magnitude values indicative of the third pose to the processor; and
calibrating the first pose sensor based on the EM field magnitude values indicative of the third pose.

11. The method of claim 10, wherein the mobile unit is a controller associated with a head-mounted display system.

12. The method of claim 10, wherein calculating a corrected pose comprises assigning a set of first weights to the first pose and a set of second weights to the second pose.

13. A system comprising:
a base unit within an electromagnetic (EM) field;
a mobile unit, located within the EM field;
an EM transmitter that generates the EM field;
an EM receiver that senses EM field magnitude values corresponding to the mobile unit's pose relative to the base unit, wherein a first pose of the mobile unit in relation to the base unit is generated;
a first pose sensor, associated with the mobile unit, that generates pose values of the mobile unit, and generates a second pose of the mobile unit;
a processor for computing an indicator that estimates the presence of EM distortion in the EM field, wherein the processor is configured to calculate a corrected pose based on a combination of the EM field magnitude values and sensor data of the first pose sensor in response to detecting that a magnitude of a first distortion of the EM field exceeds a distortion threshold, and, subsequent to calculating the corrected pose, to calibrate the first pose sensor based on second EM field magnitude values in response to detecting that a magnitude of a second distortion of the EM field does not exceed the distortion threshold.

14. The system of claim 13, wherein the mobile unit contains the EM receiver.

15. The system of claim 13, wherein the mobile unit contains the EM transmitter.

16. The system of claim 13, wherein the base unit comprises the EM receiver.

17. The system of claim 13, wherein the base unit comprises the EM transmitter.

18. The system of claim 13, wherein the mobile unit is a controller associated with a head-mounted display system.

19. The system of claim 13, wherein the first pose sensor includes one of a gyroscope and an accelerometer.

* * * * *